(12) United States Patent
Tan et al.

(10) Patent No.: US 11,923,842 B1
(45) Date of Patent: Mar. 5, 2024

(54) SYSTEM AND METHOD FOR OBTAINING USER INPUT WITH KEYBOARD INTEGRATED MAGNETIC SENSING

(71) Applicant: Dell Products L.P., Round Rock, TX (US)

(72) Inventors: Loo Shing Tan, Singapore (SG); Michiel Sebastiaan Emanuel Petrus Knoppert, Amsterdam (NL); Gerald Rene Pelissier, Mendham, NJ (US); Thomas Marcus Hinskens, Utrecht (NL)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/149,808

(22) Filed: Jan. 4, 2023

(51) Int. Cl.
*H03K 17/95* (2006.01)
*G06F 3/02* (2006.01)

(52) U.S. Cl.
CPC .......... *H03K 17/95* (2013.01); *G06F 3/0202* (2013.01)

(58) Field of Classification Search
CPC .............................. H03K 17/95; G06F 3/0202
See application file for complete search history.

(56) References Cited

U.S. PATENT DOCUMENTS

| | | | |
|---|---|---|---|
| 6,902,332 B2 * | 6/2005 | McLoone | G06F 3/0231 400/472 |
| 8,368,649 B2 | 2/2013 | Hall | |
| 8,654,095 B1 | 2/2014 | Cho et al. | |
| 9,323,356 B2 | 4/2016 | Kuo | |
| 10,719,145 B1 | 7/2020 | Files et al. | |
| 11,809,646 B1 | 11/2023 | Knoppert et al. | |
| 2005/0083316 A1 | 4/2005 | Brian et al. | |
| 2006/0205368 A1 | 9/2006 | Bustamante et al. | |
| 2007/0171205 A1 * | 7/2007 | Steinberg | H01H 36/0066 345/168 |
| 2009/0033632 A1 * | 2/2009 | Szolyga | G06F 1/1616 345/173 |
| 2010/0053085 A1 | 3/2010 | Hall | |
| 2012/0038496 A1 * | 2/2012 | Edwards | G06F 3/023 341/34 |
| 2013/0314338 A1 | 11/2013 | Nam et al. | |
| 2014/0184505 A1 * | 7/2014 | Fullerton | A63F 13/21 345/158 |
| 2014/0267150 A1 | 9/2014 | Masashi | |
| 2015/0277598 A1 | 10/2015 | Aurongzeb et al. | |
| 2016/0041678 A1 * | 2/2016 | Wu | G06F 3/0416 345/173 |

(Continued)

*Primary Examiner* — Amit Chatly
(74) *Attorney, Agent, or Firm* — Womble Bond Dickinson (US) LLP

(57) ABSTRACT

Methods and systems for providing computer implemented services using user input are disclosed. To obtain the user input, a passive human interface device may be used. The human interface device may include a magnet that may produce a magnetic field used to discern the user input. The magnet may be mechanically coupled to actuatable portions of the human interface device thereby facilitating both translation and rotation of the magnet responsive to actuations by a user. The translation and rotation of the magnet may be sensed and used to identify user input provided by the user. Sensing elements integrated into a keyboard may be used to obtain user input from the human interface device.

18 Claims, 9 Drawing Sheets

(56) References Cited

U.S. PATENT DOCUMENTS

| | | |
|---|---|---|
| 2016/0299606 A1 | 10/2016 | Go |
| 2016/0313819 A1 | 10/2016 | Ancona et al. |
| 2018/0314316 A1* | 11/2018 | Xu ................. G06F 1/1677 |
| 2019/0113966 A1 | 4/2019 | Connellan et al. |
| 2019/0187856 A1 | 6/2019 | Bruwer et al. |
| 2019/0339776 A1 | 11/2019 | Rosenberg et al. |
| 2020/0004346 A1 | 1/2020 | Vlasov et al. |
| 2020/0371625 A1 | 11/2020 | Katsurahira et al. |
| 2022/0352635 A1* | 11/2022 | Compton ............ H05K 1/0393 |

* cited by examiner

SYSTEM AND METHOD FOR OBTAINING USER INPUT WITH KEYBOARD INTEGRATED MAGNETIC SENSING

FIELD

Embodiments disclosed herein relate generally to user input in computing systems. More particularly, embodiments disclosed herein relate to systems and methods to obtain user input.

BACKGROUND

Computing devices may provide computer implemented services. The computer implemented services may be used by users of the computing devices and/or devices operably connected to the computing devices. The computer implemented services may be performed using input from users. For example, users of computing devices may provide input as part of the computer implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
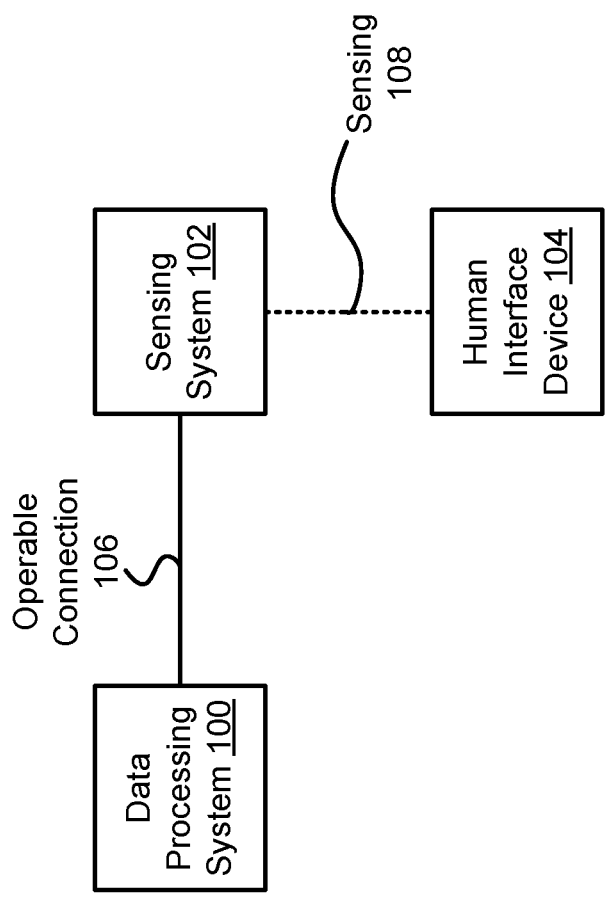
FIG. 1 shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing computer implemented services. To provide the computer implemented services, user input may be obtained.

To obtain the user input, a human interface device may be used. The human interface device may be actuated by a user, and the actuations may be translated into magnetic fields detectable by a sensing system.

The sensing system may sense the magnetic fields and obtain information reflecting changes in the position and/or orientation of a magnet of the human interface device that generates the magnetic fields. Thus, information reflecting actuations of the human interface device by the user may be encoded in the magnetic fields and may be sensed.

The obtain information may then be used to identify, for example, user input provided by the user. For example, the information regarding changes in the position and/or orientation of the magnet may be translated into user input. The user input may then be used to drive computer implemented services.

For example, the user input may be provided by the user to activate certain functionalities, change functionalities, terminate functionalities, and/or invoke desired activities by a data processing system.

By using a magnet and mechanical linkage to the magnet, the human interface device may not need to be powered, may include fewer components thereby reducing the likelihood of component failures, may be made lighter/smaller thereby reducing loads placed on user of user input devices, etc.

To sense the magnetic field, one or more sensing elements may be integrated into a keyboard or other type of device. The keyboard may provide information regarding actuations of the keyboard as well as information regarding actuations of human interface devices positioned near the keyboard.

By doing so, a system in accordance with embodiments disclosed herein may have improved portability and usability when compared to other types of devices used to obtain user input that may be powered. Thus, embodiment disclosed herein may address, among others, the technical challenge of loads placed on users during acquisition of user input and mechanical or electrical failure of devices tasked with obtaining user input.

In an embodiment, a sensing system is provided. The sensing system may include a keyboard adapted to receive first user input from a user; a sensing element adapted to obtain second user input from the user via a passive human interface device; and an interface that is: operably connected to the keyboard and the sensing element, the operable connection enabling the first user input and the second user input to be obtained by the interface, and adapted to provide the first user input and the second user input to a data processing system.

The keyboard may include a body; and buttons to obtain the first user input. The sensing element may be positioned inside of the body.

The sensing system may also include a first sensing array of sensing elements, the first sensing array comprising the sensing elements, and the first sensing array being positioned along a length of a first side of the body. The sensing system may further include a second sensing array of the sensing elements, and the second sensing array being positioned along a length of a second side of the body. The sensing system may also include a third sensing array of the sensing elements, and the third sensing array being positioned along a length of a third side of the body.

The first side and the third side may be on opposite sides of the body. The second side may directly connect the first side to the third side. The second sensing array may be adapted to obtain third user input from the user via a second passive human interface device.

Obtaining the second user input from the user via the passive human interface device may include sensing, using the first sensing array, a distribution of a static magnetic field emanating from the passive human interface device; and identifying, based on the sensed distribution, an actuation of the passive human interface device.

Identifying the actuation of the passive human interface device may include identifying, based on the sensed distribution, a change in at least one characteristic selected from a group of characteristics consisting of: a position of a magnetic of the passive human interface device; and an orientation of the magnetic of the passive human interface device.

Identifying the actuation of the passive human interface device may also include identifying the actuation based on a type of the passive human interface device and the change in the at least one characteristic.

The sensing element may be hidden from an ambient environment. The sensing element may be a magnetic field sensing element. The sensing element may be to sense a magnitude and a direction of a magnetic field to which the sensing element is exposed.

In an embodiment, a user input system is provided. The user input system may include a human interface device and a sensing system as discussed above.

In an embodiment, a data processing system is provided. The data processing system may include a user input system as discussed above, a processor, and a memory coupled to the processor to store instructions, which when executed by the processor, cause the processor to perform operations for obtaining user input using data obtained from the sensing system.

In an embodiment, a non-transitory media is provided. The non-transitory media may include instructions that when executed by a processor operations for obtaining user input using data obtained from the sensing system, as discussed above.

Turning to FIG. 1, a block diagram illustrating a system in accordance with an embodiment is shown. The system shown in FIG. 1 may provide computer implemented services. The computer implemented services may include any type and quantity of computer implemented services. For example, the computer implemented services may include data storage services, instant messaging services, database services, and/or any other type of service that may be implemented with a computing device.

To provide the computer implemented services, user input may be obtained. The user input may indicate, for example, how the computer implemented services are to be provided. The user input may include any type and quantity of information.

To obtain the user input, a user may perform physical actions such as, for example, pressing buttons, moving structures, etc. These physical actions (and/or results of the actions) may be sensed by various devices, and the sensing may be interpreted (e.g., translated) into the user input (e.g., data).

However, sensing physical actions by a user may involve use of sensors and/or devices that may consume power. The weight of the devices and forces applied by sources of the consumed power (e.g., batteries, cords to power supplies, etc.) may place a load (e.g., mechanical) on the user attempting to perform the physical actions. The mechanical load may fatigue the user, reduce the portability of the devices (e.g., mouses), and/or may be undesirable for other reasons.

In general, embodiments disclosed herein may provide methods, systems, and/or devices for obtaining user input and/or using the obtained user input to provide computer implemented services. To provide the computer implemented services, a system may include data processing system 100.

Data processing system 100 may include hardware components usable to provide the computer implemented services. For example, data processing system 100 may be implemented using a computing device such as a laptop computer, desktop computer, portable computer, and/or other types of computing devices.

Data processing system 100 may host software that may use user input to provide the computer implemented services. For example, the software may provide user input fields and/or other elements through which the user may provide information to manage and/or use the computer implemented services provided by data processing system 100.

To obtain the information from the user, data processing system 100 may obtain signals and/or data from sensing system 102 (e.g., via operable connection 106). Data processing system 100 may interpret (e.g., translate) the signals (e.g., may be analog, data processing system 100 may include an analog to digital converter) and/or data (e.g., digital data) to obtain the user input.

Sensing system 102 may track (e.g., by sensing 108) and/or provide information regarding tracking of human interface device 104, and provide the signals and/or data to data processing system 100. A user may physically interact with human interface device 104, thereby allowing the signals and/or data provided by sensing system 102 to include information regarding the physical actions of the user. While described in FIG. 1 with respect to a single human interface device, it will be appreciated that sensing system 102 may track and provide information regarding any number of human interface devices without departing from embodiments disclosed herein.

For example, if a user moves human interface device 104, sensing system 102 may track the change in position and/or motion of human interface device 104 and provide signals and/or data reflecting the changes in position and/or motion. Similarly, if a user actuates an actuatable portion (e.g., buttons) of human interface device 104, sensing system 102 may track the actuation of the actuatable portion and provide signals and/or data reflecting the actuation.

To track human interface device 104, sensing system 102 may include one or more sensors that sense a magnetic field emanating from human interface device 104. The sensors may use the sensed magnetic field to track a location (absolute or relative) and orientation (absolute or relative) of a magnet embedded in human interface device 104. The sensors may generate the signals and/or data provided by sensing system 102 to data processing system 100. The sensors may sense the magnitude and/or direction of the magnetic field that passes proximate to each sensor. By knowing the relative placements of the sensors with respect to one another, the position and/or orientation of the magnet may be identified based on the sensed magnetic fields to which the sensors are exposed (e.g., the magnetic field may be treated as emanating from a magnet with known dimensions and/or strength, and/or other assumptions may be made to deduce the location and/or orientation of the magnet).

Sensing system 102 may also include, for example, analog to digital converters, digital signal processing devices or other signal processing devices (e.g., also referred to as a "signal processing chain"), and/or other devices for generating the signals and/or data based on information obtained via the sensors.

In an embodiment, sensing system 102 is integrated with another human interface device. For example, sensing system 102 may be implemented with a keyboard thereby allowing sensing system to provide user input from multiple sources (e.g., buttons of the keyboard, and any number of human interface devices positioned thereby).

Human interface device 104 may be implemented with a physical device that a user may actuate in one or more ways. For example, human interface device 104 may (i) be moveable, (ii) may include one or more buttons, (iii) may include one or more scroll controls, and/or (iv) may include other actuatable elements. Actuating human interface device 104 may change the orientation and/or position of the magnet with respect to the sensors of sensing system 102.

For example, when human interface device 104 is move away from sensing system 102, the strength of the magnetic field emanating from the magnet as sensed by sensors of sensing system 102 may decrease. Similarly, when buttons or other actuatable elements of human interface device 104 are actuated, the magnet may be rotated (e.g., in one or more planes) thereby changing the direction of the magnetic field sensed by sensors of sensing system 102. Refer to FIGS. 2A-2F for additional details regarding sensing of human interface device 104.

Human interface device 104 may be a passive device. For example, human interface device 104 may not consume power, include batteries or sensors (or other components that may consume power during operation), etc. Rather, to convey information to sensing system 102, human interface device 104 may include a permanent magnet mechanically coupled to actuatable portions. Thus, information regarding actuation of human interface device 104 may be encoded in a static magnetic field produced by the permanent magnet and sensed by sensing system 102. Consequently, human interface device 104 may be of smaller size, lower weight, and/or may provide other advantages when compared to active devices such as a computer mouse. Refer to FIGS. 2B-2G for additional details regarding human interface device 104.

Data processing system 100 may perform a lookup or other type of operation to translate the signals and/or data from sensing system 102 into user input. Once obtained, the user input may be used to drive downstream processes.

Figure 3:
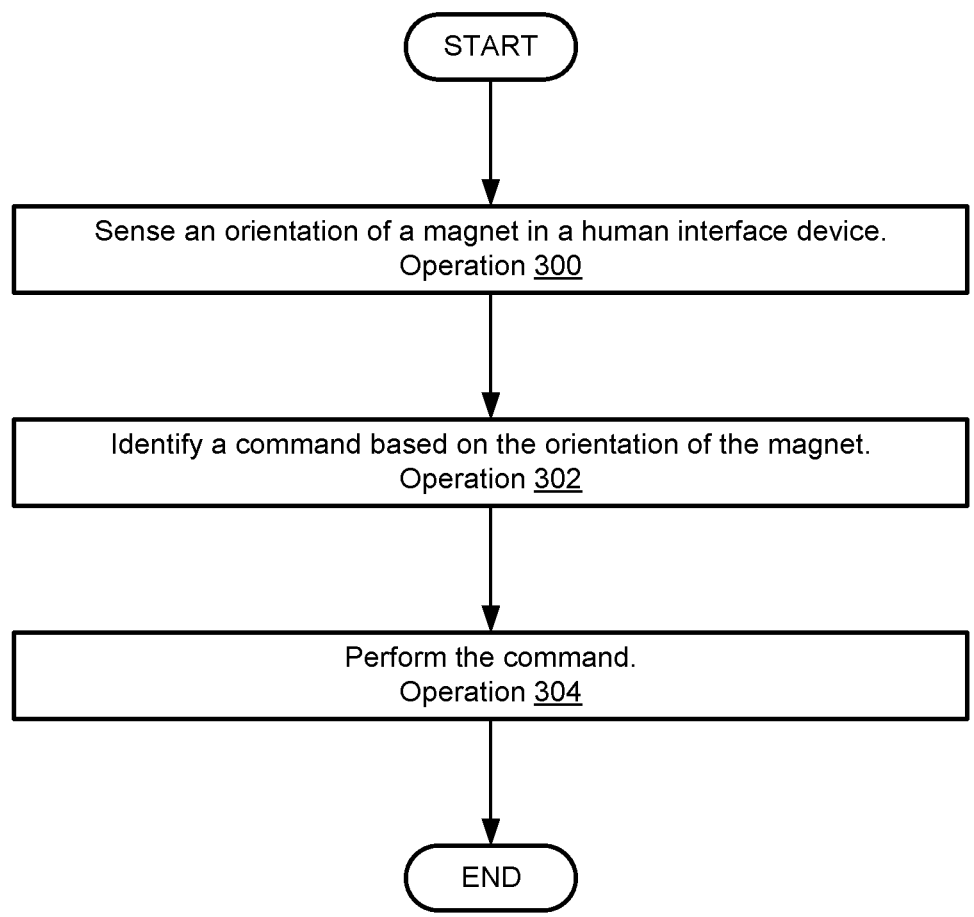
FIG. 3 shows a flow diagram illustrating a method of obtaining user input and providing computer implemented services in accordance with an embodiment.

When providing its functionality, data processing system 100 and/or sensing system 102 may perform all, or a portion, of the method illustrated in FIG. 3.

Data processing system 100 may be implemented using a computing device (also referred to as a data processing system) such as a host or a server, a personal computer (e.g., desktops, laptops, and tablets), a "thin" client, a personal digital assistant (PDA), a Web enabled appliance, a mobile phone (e.g., Smartphone), an embedded system, local controllers, an edge node, and/or any other type of data processing device or system. For additional details regarding computing devices, refer to FIG. 4.

Any of the components illustrated in FIG. 1 may be operably connected to each other (and/or components not illustrated). For example, sensing system 102 may be operably connected to data processing system 100 via a wired (e.g., USB) or wireless connection. Sensing system 102 may include a chipset or other component to implement and provide an interface to data processing system 100 via the wired and/or wireless connection. The interface of sensing system 102 may be connected to, for example, buttons of the keyboard in which sensing system 102 may be integrated, any number of sensing arrays and/or sensing elements of sensing system 102, and/or other components (e.g., signal processing chains, etc.) thereby allowing interface to obtain user input provided by the user via the keyboard and any number of human interface devices.

As noted above, human interface device 104 may not be operably connected to other devices (e.g., may be a passive device), but may be sensed by sensing system 102 via sensing 108. For example, during sensing 108, a static magnetic field emanating from human interface device 104 may be sensed by sensing system 102 to obtain the user input.

While illustrated in FIG. 1 as included a limited number of specific components, a system in accordance with an embodiment may include fewer, additional, and/or different components than those illustrated therein.

Figure 2A:
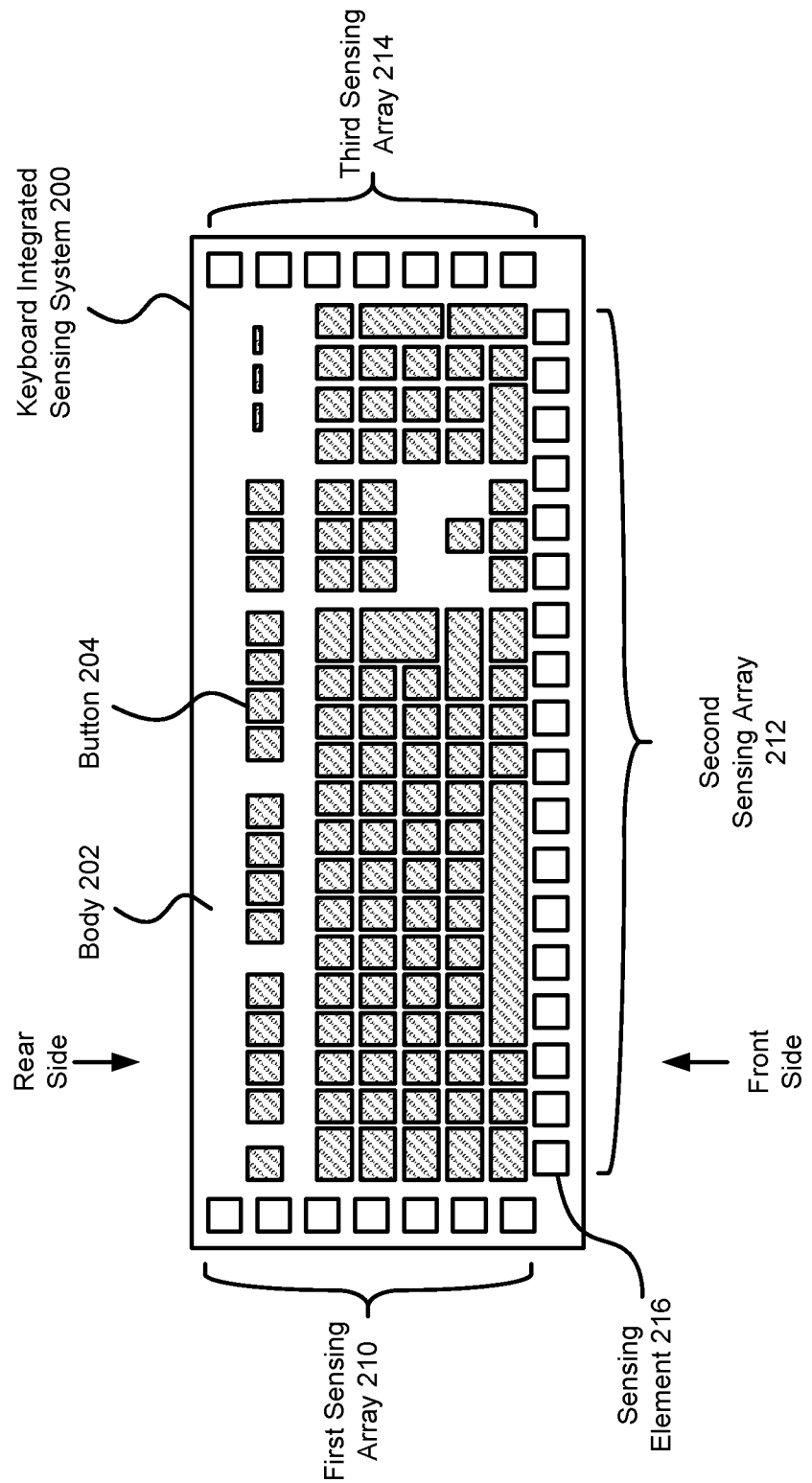
FIG. 2A shows a diagram illustrating a sensing system in accordance with an embodiment.
Figure 2B:
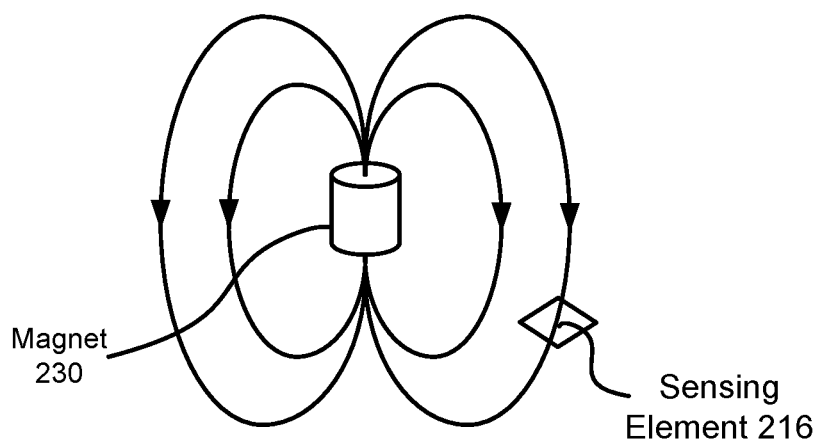
FIGS. 2B-2C show diagrams illustrating field sensing in accordance with an embodiment.
Figure 2C:
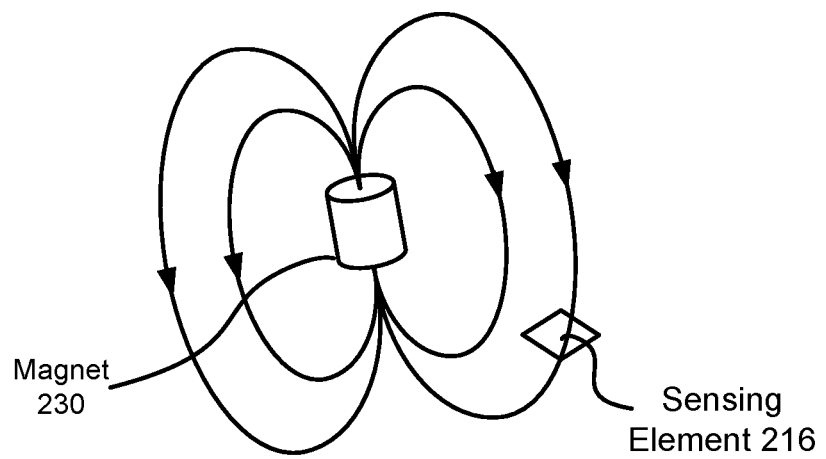

To further clarify embodiments disclosed herein, diagrams illustrating sensing of human interface device 104 by sensing system 102 in accordance with an embodiment are shown in FIGS. 2A-2C.

Turning to FIG. 2A, a diagram of an example implementation of sensing system 102 in accordance with an embodiment is shown. As discussed above, sensing system 102 may be integrated with other types of devices such as keyboards. Keyboard integrated sensing system 200 may include functionality of a keyboard and a sensing system. To provide this functionality, keyboard integrated sensing system 200 may include body 202, buttons (e.g., 204) corresponding to keys of a keyboard (and/or other types of interface elements such as scroll wheels, etc.), and any number of sensing elements (e.g., 216) for sensing actuation of human interface devices positioned nearby. Each of these components are discussed below.

Body 202 may be implemented using a case or other type of structure in which various components may be placed on and/or inside thereof. For example, the case may be a keyboard case which may include various portions (e.g., such as plastic parts produced through forming processes such as injection molding). Body 202 may include a surface on which buttons (e.g., 204) may be positioned.

Body 202 may also include an interior region in which various components may be positioned. These components may include (i) button sensing elements to identify when the buttons are pressed, (ii) signal processing components coupled to the sensing elements to generate electrical signals corresponding to actuations of buttons 204, (iii) signal aggregation components that allow the electrical signals to be stored and routed, (iv) communication components such as chipsets that allow the signals routed to the communication components to be transmitted to a data processing system (e.g., thereby establishing an interface to the data processing system through which information may be exchanged), and/or (v) other types of components for obtaining user input, generating signals corresponding to the user input, and providing the signals to other devices to which keyboard integrated sensing system 200 may be operably connected.

Button 204 may be implemented with, for example, (i) a keycap which a user may press to provide user feedback, (ii) a switch or other structure that is coupled to the keycap and that generates (or facilitates generation of) an electrical signal when the keycap is actuated by a user, and/or (iii) other types of components for obtaining user input, generating signals corresponding to the user input, and providing the signals to other devices. Keyboard integrated sensing system 200 may include any number of button 204 and/or other components which a user may actuate to provide user feedback.

Sensing element 216 may be implemented with a sensor. The sensor may include functionality to measure and intensity and direction of a magnetic field to which sensing element 216 is exposed. Keyboard integrated sensing system 200 may include any number of sensing elements 216.

In an embodiment, the sensing elements are organized into different arrays. Each of the arrays may include similar or different numbers and/or types of sensing elements (each array may be homogenous or heterogenous with respect to sensing element type, different types of sensing elements may have different capabilities such as a noise floor).

In an embodiment, the sensing elements are arranged in three arrays (e.g., 210, 212, 214). First sensing array 210 may be positioned on a first side of body 202. Second sensing array 212 may be positioned on a second side of body 202. Third sensing array 214 may be positioned on a third side of body 202. The first side and the second side may be on opposite sides of body 202. The second side may connect the first side to the third side.

The sensing elements of each of the sensing arrays may be positioned inside of body 202. For example, the sensing arrays may be positioned in an interior of body 202. Thus, while not directly on each of the sides, the sensing arrays may be positioned close to the sides (e.g., separated by a thickness of body 202).

First sensing array 210 and third sensing array 214 may be positioned along the lengths of lines that are substantially parallel (e.g., within 5° of being parallel, or are intended to be parallel but deviate from being parallel due to manufacturing limits) to each other. In contrast, second sensing array 212 may be positioned along a length of a line that is substantially perpendicular to the lengths of the lines in which first sensing array 210 and third sensing array 214 are positioned.

While illustrated in FIG. 2A as having specific shapes and sizes, it will be appreciated that the shapes of sensing elements (e.g., 216) are merely illustrative and the shapes may be different without departing from embodiments disclosed herein.

By positioning the sensing elements as discussed above, one or more human interface devices positioned by keyboard integrated sensing system 200 may allow a user to provide user input. The user input may be obtained by tracking of magnetic fields using the sensing elements. The tracked magnetic fields may be used to identify the user input. Refer to FIGS. 2B-2G for additional details regarding obtaining user input.

Turning to FIGS. 2B-2C, diagrams illustrating a magnet (e.g., 230) and sensing element 216 in accordance with an embodiment are shown. As noted above, human interface device 104 may include magnet 230 (e.g., a permanent magnet). Magnet 230 may project a magnetic field. In these figures, the magnetic field is illustrated using lines with arrows superimposed over the midpoints of the lines. The direction of the arrow indicates and orientation of the field.

As seen in FIG. 2B, when magnet 230 is proximate (e.g., within a predetermined distance range, which may vary depending on the strength of magnet 230 and sensitivity level of sensing element 216) to sensing element 216, the magnetic field may be of sufficient strength to be measurable by sensing element 216. Sensing element 216 may utilize any sensing technology to measure the magnitude and/or the orientation of the magnetic field at its location. Due to the magnetic field distribution of magnet 230, the magnitude and orientation of the magnetic field at the location of sensing element 216 may be usable to identify, in part, the location and orientation of magnet 230.

For example, when magnet 230 is rotated as shown in FIG. 2C from the orientation as shown in FIG. 2B, the direction and/or magnitude of the magnetic field at the location of sensing element 216 may change. By identify the magnitude and orientation of the magnetic field at a number of locations (e.g., corresponding to different sensing elements), the position and orientation of magnet 230 may be identified.

To utilize the location and orientation of the magnet embedded in human interface device 104 to obtain user input, magnet 230 may be mechanically coupled to the actuatable elements and/or body of the human interface device. By doing so, information regarding actuation of the human interface device by a user may be encoded into the magnetic field projected by magnet 230 and sensed by sensing element 216.

Figure 2D:
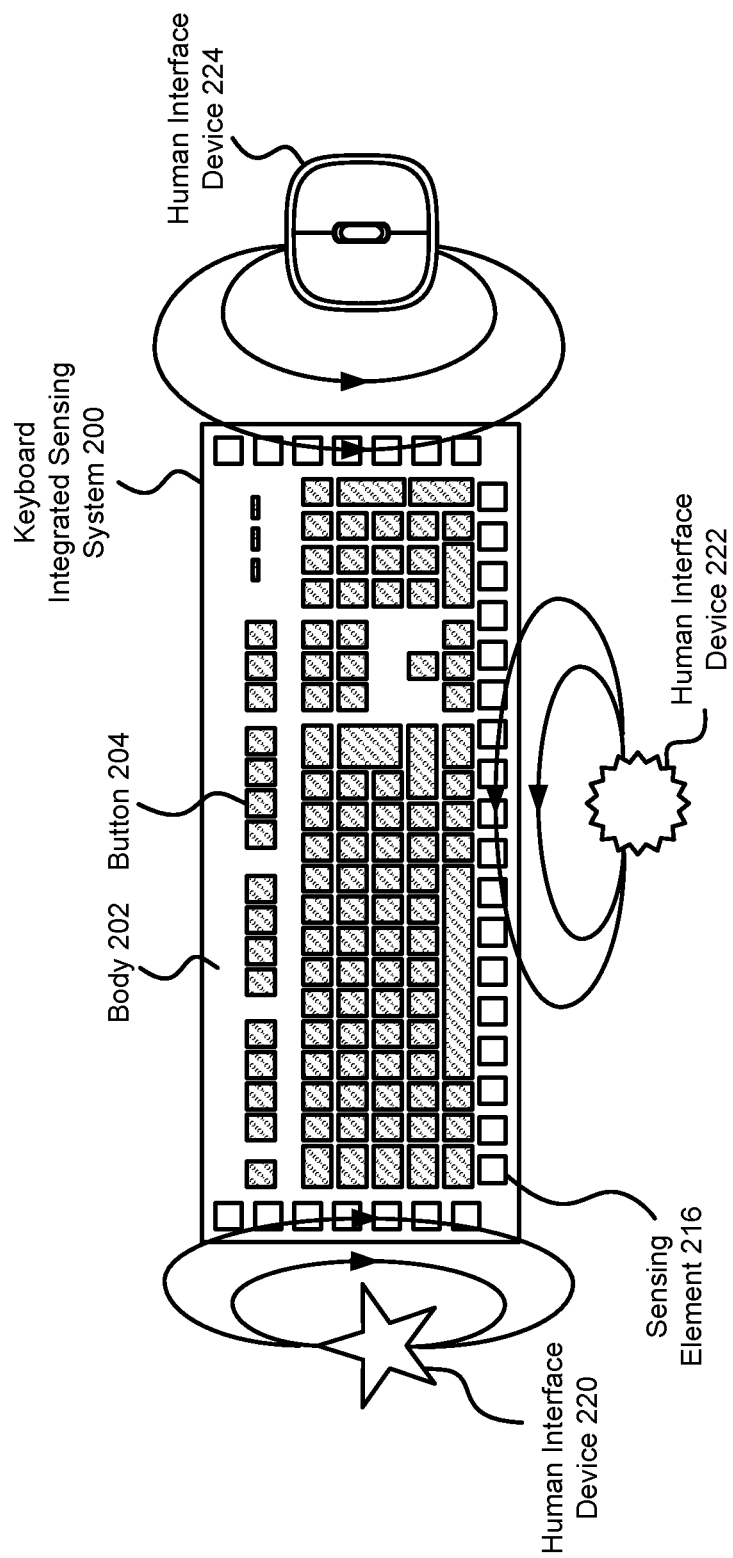
FIGS. 2D-2G show diagrams illustrating sensing of human interface devices in accordance with an embodiment.
Figure 2E:
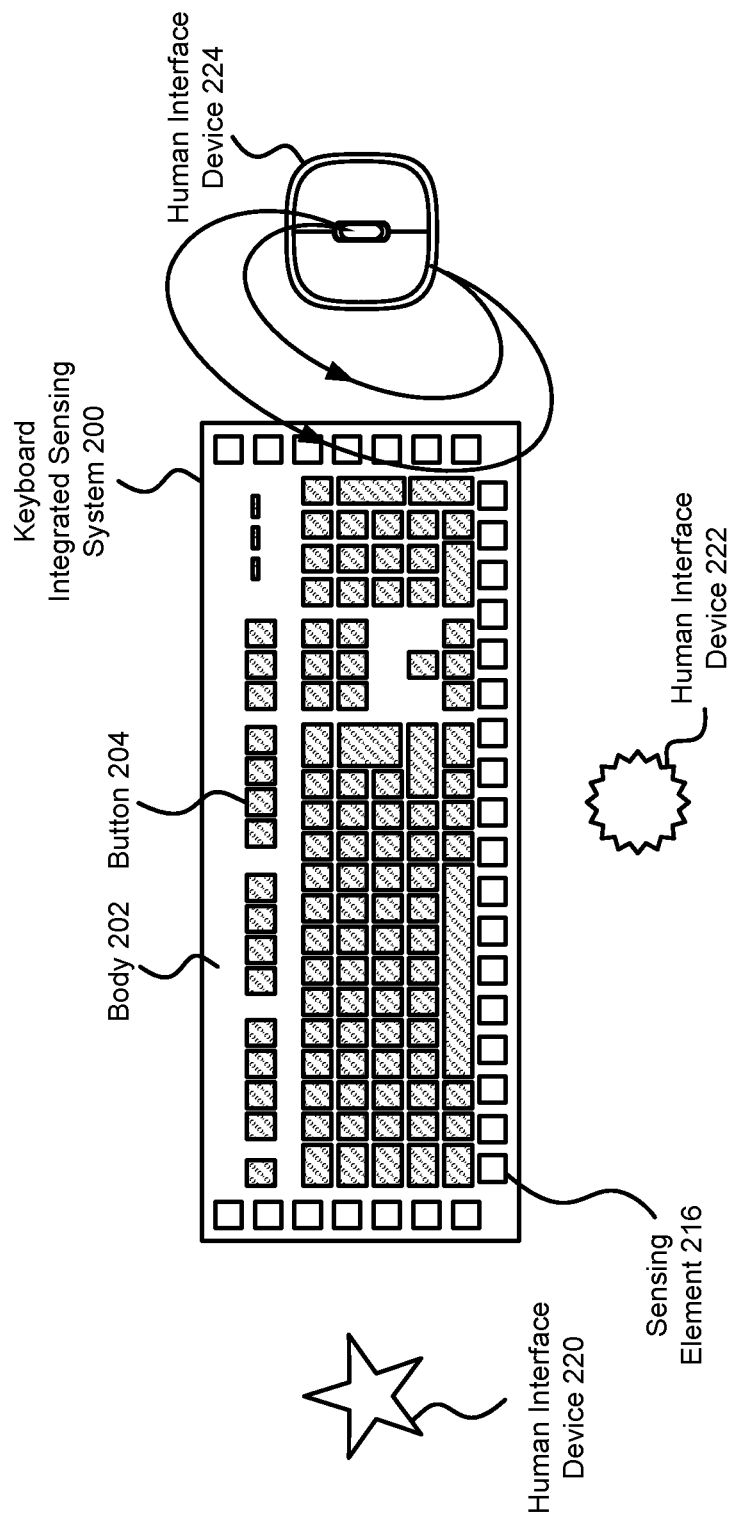

Turning to FIGS. 2D-2E, diagrams illustrating sensing of the magnetic field projected by a magnet of a human interface device in accordance with an embodiment are shown.

In FIG. 2D, a top view diagram of multiple human interface devices (e.g., 220-224) positioned by keyboard integrated sensing system 200 in accordance with an embodiment is shown. In FIG. 2D, only a portion of magnetic fields projected by magnets positioned in the human interface devices are illustrated for clarity. For example, the fields may be symmetrical and may extend further than as shown in the figure. Additionally, the field orientation may be different from that shown in FIG. 2D (e.g., the fields may be oriented into/out of the page rather than along the page).

As seen in FIG. 2D, magnetic fields (illustrated similarly to that shown in FIGS. 2B-2C) emanating from each of the human interface devices may be limited in extent. Consequently, only some of the sensing elements of each sensing array may be able to sense the respective fields. Further, by virtue of the relative placement of each of the sensing arrays, the respective sensing arrays may substantially isolated, to an extent, from the magnetic fields emanating from other human interface devices.

For example, the first sensing array may substantially sample the magnetic field emanating from human interface device 220 while the second sensing array may substantially sample the magnetic field emanating from human interface device 220. Consequently, the information obtained by the sensing elements of each of the arrays may allow for actuation of the human interface device positioned nearby to be identified.

For example, consider a scenario where human interface device 224 is implemented as a mouse form factor, with the buttons of the mouse mechanically coupled to the magnet positioned therein to change the orientation of the magnet when the buttons are pressed. As seen in FIG. 2D, while the buttons are not pressed, the magnetic field from human interface device 224 that is sampled by the third sensing array may encode information indicating that the buttons are not pressed.

However, turning to FIG. 2E, when one of the buttons of human interface device 224 is pressed, the orientation of the magnet within human interface device 224 may change thereby modifying the magnetic field distribution. As seen in FIG. 2E, for example, both the magnitude and direction of the magnetic field, as sampled by the sensing elements of the third sensing array may change. Consequently, the sensing elements of the third sensing array may provide signals and/or data indicating a change in the field, orientation of the magnet, and/or change in user input provided by human interface device 224. The signals/data may be routed to the interface of keyboard integrated sensing system 200 (e.g., which may or may not be sent through and/or processed by a signal processing chain). Consequently, both user input obtained via buttons (e.g., 204) and any number of human interface devices may be provided to a data processing system via the interface. Other human interface devices may operate similarly.

Figure 2F:
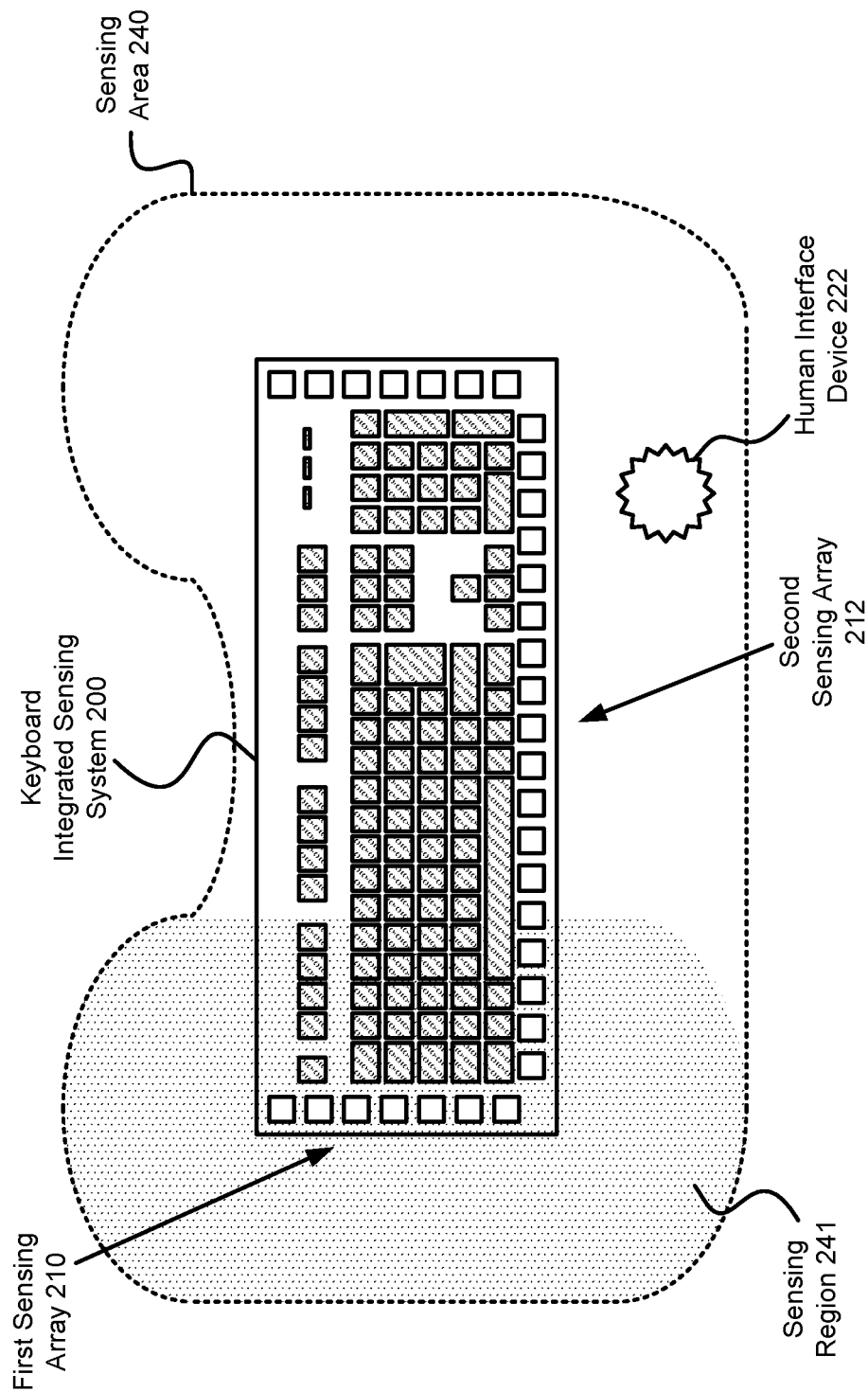

The combination of the sensing arrays may provide sensing coverage on multiple sides of keyboard integrated sensing system 200. Turning to FIG. 2F, a diagram of keyboard integrated sensing system 200 with sensing area 240 in accordance with an embodiment is shown.

Sensing area 240 (drawn with dashed outline) may be an area proximate to keyboard integrated sensing system 200 in which human interface devices may be sensed. By virtue of the placement of the sensing arrays, sensing area 240 may extend on a front side, both lateral sides, and a rear side of keyboard integrated sensing system 200. Consequently, a user may position human interface devices in any of these areas and provide user input. For example, as seen in FIG. 2F, human interface device 222 may be used by a user to provide user input while positioned within sensing area 240.

Different sensing arrays may be sensitive with respect to devices positioned in different regions of sensing area 240. For example, first sensing array 210 may be adapted to sense human interface devices positioned within the sensing area 242, drawn with dotted infill. Other sensing arrays may be associated with similar sensing regions. The sensing regions may be independent (e.g., non-overlapping) or coextensive (e.g., overlapping). For example, the sensing regions associated with the first sensing array and the second sensing array may partially overlap (e.g., where the sensing arrays are positioned closer to one another).

The extent of sensing regions are 240 may depend, for example, on the sensitivity and/or number of the sensing elements, a strength of the magnetic field emanating from the human interface devices, and/or other factors.

While illustrated in FIG. 2F as extending laterally from keyboard integrated sensing system 200, sensing are 240 may extend above and/or below keyboard integrated sensing system 200.

Figure 2G:
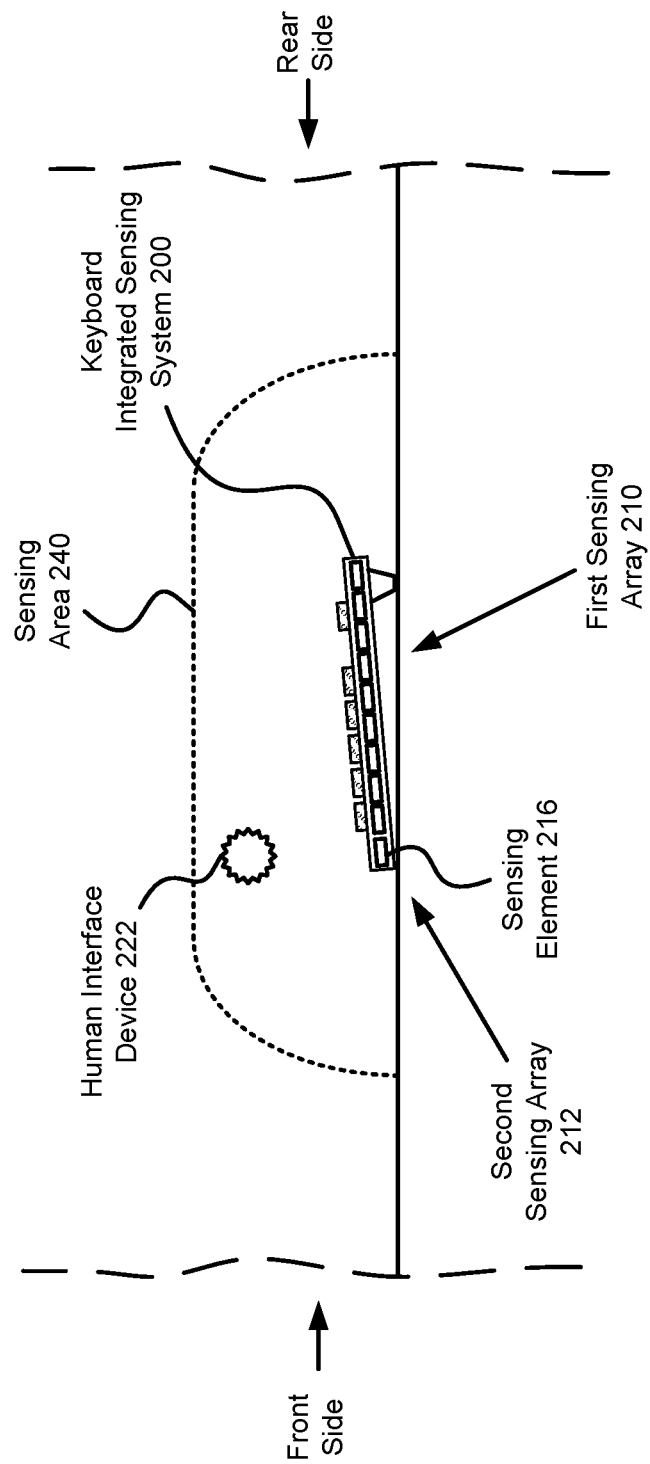

Turning to FIG. 2F, a side view diagram of keyboard integrated sensing system 200 with sensing area 240 in accordance with an embodiment is shown. In FIG. 2G, the wavy lines drawn in long dashing indicate that the surface on which keyboard integrated sensing system 200 is positioned may continue passed the wavy dashed lines.

As seen in FIG. 2G, sensing area 240 may extend above keyboard integrated sensing system 200. Consequently, when human interface device 222 is positioned above the surface upon which keyboard integrated sensing system 200 is positioned, user input may continue to be obtained from the device. For example, consider a scenario in which human interface device 222 is implemented as a stylus and a user is interacting with a virtual, three dimensional environment. The position and orientation of a magnet within the stylus and with respect to the sensing arrays (e.g., 210, 212) may be used to identify user input indicating movement and/or changes in orientation in three dimensional space. The user input, when provided to an application managing the virtual, three dimensional environment, may allow the user to modify a position and/or orientation of a cursor or other element within the environment (may be displayed on a screen thereby allowing the user to move the cursor in the environment by moving the stylus).

When tracking human interface device 222 above keyboard integrated sensing system 200, multiple sensing arrays may be utilized. For example, to track the location/orientation in three dimension, two sensing arrays that are in lines perpendicular to one another may be used. For example, first and second sensing arrays (e.g., 210, 212) may be utilized to obtain additional measurements regarding the magnetic field emanating from human interface device 222.

While FIGS. 2A-2G have been illustrated as including specific numbers and types of components, it will be appreciated that any of the devices depicted therein may fewer, additional, and/or different components without departing from embodiments disclosed herein.

For example, while shown with three sensing arrays having specific shapes, sizes, positions, and orientations, it will be appreciated that there may be different numbers (more or fewer) of sensing arrays. For example, only sensing arrays on two sides of keyboard integrated sensing system 200 may be present (thereby limiting the numbers of human interface devices that may be utilized at a time). Further, the sensing arrays may be positioned differently from that illustrated herein. For example, the sensing arrays may be positioned towards interior regions of keyboard integrated sensing system 200, may be skewed or not aligned with the sides, etc.

Additionally, while illustrated with specific human interface devices being positioned on specific sides of the keyboard integrated sensing system 200, the human interface devices may be positioned differently (e.g., swapped/moved to different sides) without departing from embodiments disclosed herein.

As discussed above, the components of FIG. 1 may perform various methods to provide computer implemented services using user input. FIG. 3 illustrates a method that may be performed by the components of FIG. 1. In the diagram discussed below and shown in FIG. 3, any of the operations may be repeated, performed in different orders, and/or performed in parallel with or in a partially overlapping in time manner with other operations.

Turning to FIG. 3, a flow diagram illustrating a method of obtaining user input in accordance with an embodiment is shown. The method may be performed by data processing system 100, sensing system 102, human interface device 104, and/or other components of the system of FIG. 1.

At operation 300, an orientation and/or position of a magnet in a human interface device is sensed. The orientation and/or positioned may be sensed by (i) obtaining measurements of a magnetic field emanating from the magnet, and (ii) computing the position and/or orientation based on the measurements.

In an embodiment, the orientation and position of multiple magnetics positioned in respective human interface device is sensed. The sensing may be performed using multiple sensing arrays.

Signals and/or data reflecting the orientation and/or position of the magnet may be provided to an interface and through which a data processing system may receive the signal/data. The interface may also allow information regarding the actuation of other devices (e.g., such as an integrated keyboard) to also be provided to the data processing system.

At operation 302, a command (or multiple) is identified based on the orientation and/or position of the magnet(s).

The command may be identified, for example, by comparing the position and/or orientation to a past position and/or orientation.

The command may be identified by (i) identifying an orientation of the magnet in a first plane, (ii) identifying an orientation of the magnet in the second plane, and (iii) identifying the location of the magnet with respect to a sensing system.

The orientation of the magnet in the first plane may be used to a perform a lookup based on a degree and direction of rotation of the magnet in the first plane. For example, if positively rotated by an amount exceeding a threshold, then the command may be identified as a left click of a pointing device, an activation of a button on a stylus, etc. In another example, if negatively rotated by the amount exceeding the threshold, then the command may be identified as a right click of the pointing device, actuation of a second button on the stylus, etc.

The orientation of the magnet in the second plane may be used to a perform a similar process, but may use a different lookup table. In this manner, different commands may be identified using different properties of the magnet.

At operation 304, the command is performed. The command may be performed, for example, by an operating system passing through or otherwise providing information regarding the command to an application or other consumer of the user input. The consumer may then take action based on the command.

For example, a data processing system may host an operating system, drivers, and/or other executing entities that may take responsibility for translating signals/data from a sensing system into commands or other types of user input.

The method may end following operation 304.

Thus, using the method illustrated in FIG. 3, embodiments disclosed herein may facilitate obtaining user input and using the user input to provide computer implemented services. By obtaining the user input via a passive device (at least with respect to user input), a human interface device in accordance with embodiments disclosed herein may be of lower complexity thereby improving the likelihood of continued operation, may not be dependent on power sources, may not require as large of physical loads to be exerted by users, and may provide other benefits. By integrating multiple sensing arrays with a keyboard, multiple human interface devices may be used by a user to provide user input to a data processing system.

Figure 4:
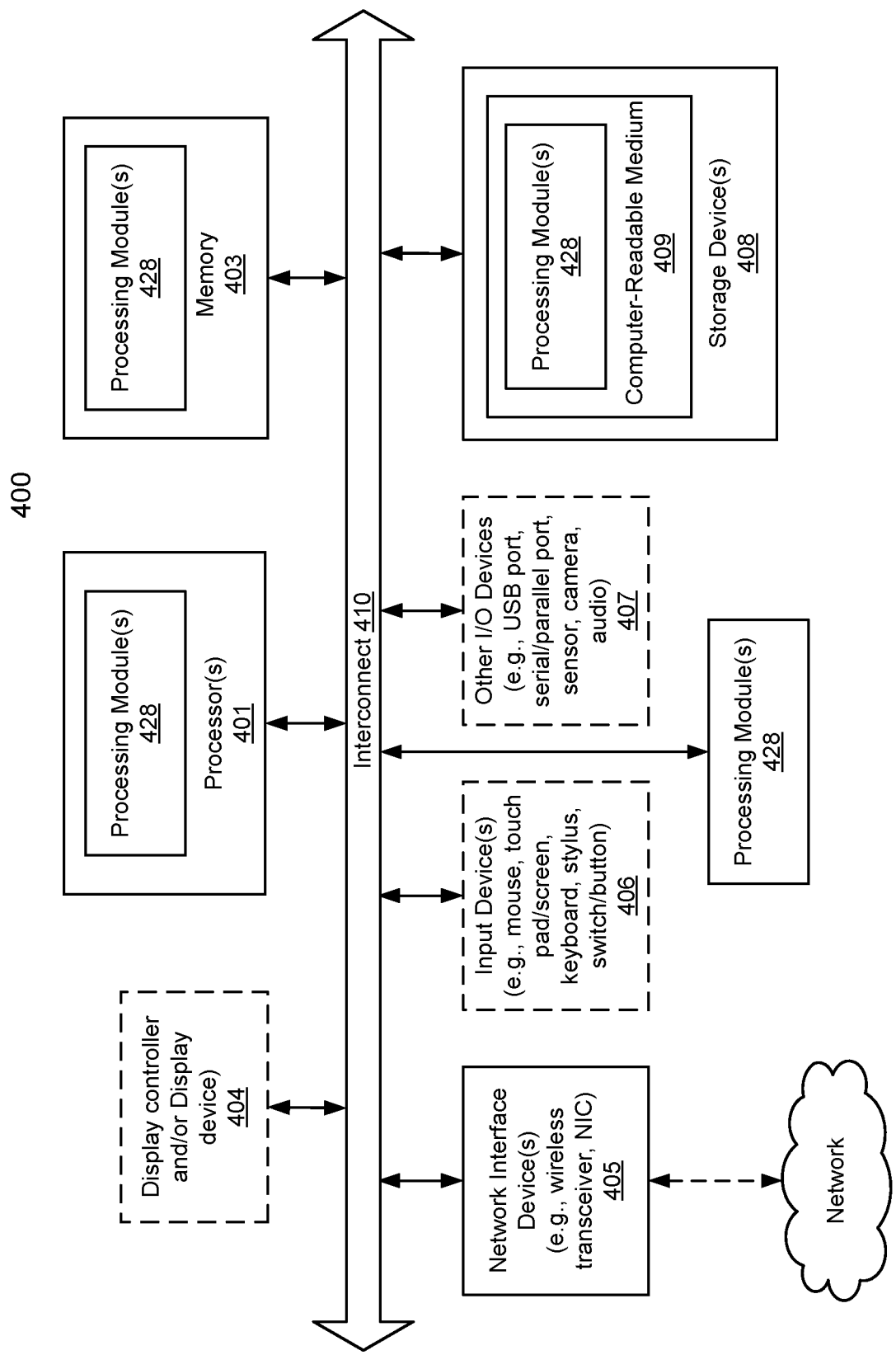
FIG. 4 shows a block diagram illustrating a data processing system in accordance with an embodiment.

Any of the components illustrated in FIGS. 1-2G may be implemented with one or more computing devices. Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional 10 device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A sensing system, comprising: a keyboard adapted to receive first user input from a user; a sensing element adapted to obtain second user input from the user via a passive human interface device, wherein obtaining the second user input comprises: sensing, using the sensing element, a distribution of a static magnetic field emanating from a magnet of the passive human interface device; identifying, based on the sensed distribution, a change in at least one characteristic selected from a group of characteristics consisting of: a position of the magnet of the passive human interface device, and an orientation of the magnet of the passive human interface device; and identifying, based on identifying the change, an actuation of the passive human interface device; and an interface that is:
    operably connected to the keyboard and the sensing element, the operable connection enabling the first user input and the second user input to be obtained by the interface, and adapted to provide the first user input and the second user input to a data processing system.

2. The sensing system of claim 1, wherein the keyboard comprises:
    a body; and
    buttons to obtain the first user input,
    wherein the sensing element is positioned inside of the body.

3. The sensing system of claim 2, further comprising:
    a first sensing array of sensing elements, the first sensing array comprising the sensing elements, and the first sensing array being positioned along a length of a first side of the body.

4. The sensing system of claim 3, further comprising:
    a second sensing array of the sensing elements, and the second sensing array being positioned along a length of a second side of the body.

5. The sensing system of claim 4, further comprising:
    a third sensing array of the sensing elements, and the third sensing array being positioned along a length of a third side of the body.

6. The sensing system of claim 5, wherein the first side and the third side are on opposite sides of the body.

7. The sensing system of claim 6, wherein the second side directly connects the first side to the third side.

8. The sensing system of claim 4, wherein the second sensing array is adapted to obtain third user input from the user via a second passive human interface device.

9. The sensing system of claim 1, wherein identifying the actuation of the passive human interface device further comprises: identifying the actuation based on a type of the passive human interface device and the change in the at least one characteristic.

10. The sensing system of claim 2, wherein the sensing element is hidden from an ambient environment.

11. The sensing system of claim 1, wherein the sensing element is a magnetic field sensing element.

12. The sensing system of claim 10, wherein the sensing element is adapted to sense a magnitude and a direction of a magnetic field to which the sensing element is exposed.

13. A user input system, comprising:
    a passive human interface device comprising a magnet, the passive human interface device adapted to encode information from a user in a static magnetic field emanating from the magnet;
    a sensing system comprising:
    a keyboard adapted to receive first user input from the user;
    a sensing element adapted to obtain second user input from the user via the passive human interface device, wherein obtaining the second user input comprises:
    sensing, using the sensing element, a distribution of the static magnetic field emanating from the passive human interface device;
    identifying, based on the sensed distribution, a change in at least one characteristic selected from a group of characteristics consisting of: a position of the magnet of the passive human interface device, and an orientation of the magnet of the passive human interface device; and
    and identifying, based on identifying the change, an actuation of the passive human interface device;
    an interface that is:
    operably connected to the keyboard and the sensing element, the operable connection enabling the first user input and the second user input to be obtained by the interface, and
    adapted to provide the first user input and the second user input to a data processing system.

14. The user input system of claim 13, wherein the keyboard comprises:
    a body; and
    buttons to obtain the first user input,
    wherein the sensing element is positioned inside of the body.

15. The user input system of claim 14, wherein the sensing system further comprises:
    a first sensing array of sensing elements, the first sensing array comprising the sensing elements, and the first sensing array being positioned along a length of a first side of the body.

16. A data processing system, comprising:
    a passive human interface device comprising a magnet, the passive human interface device adapted to encode information from a user in a static magnetic field emanating from the magnet;

a sensing system comprising:

a keyboard adapted to receive first user input from the user;

a sensing element adapted to obtain second user input from the user via the passive human interface device, wherein obtaining the second user input comprises:

sensing, using the sensing element, a distribution of the static magnetic field emanating from the passive human interface device;

identifying, based on the sensed distribution, a change in at least one characteristic selected from a group of characteristics consisting of: a position of the magnet of the passive human interface device, and an orientation of the magnet of the passive human interface device; and identifying, based on identifying the change, an actuation of the passive human interface device; and an interface that is:

operably connected to the keyboard and the sensing element, the operable connection enabling the first user input and the second user input to be obtained by the interface, and adapted to provide the first user input and the second user input to a data processing system;

a processor; and a memory coupled to the processor to store instructions, which when executed by the processor, cause the processor to perform operations for obtaining the first user input and the second user input from the interface.

17. The data processing system of claim 16, wherein the keyboard comprises:

a body; and buttons to obtain the first user input, wherein the sensing element is positioned inside of the body.

18. The data processing system of claim 17, wherein the sensing system further comprises:

a first sensing array of sensing elements, the first sensing array comprising the sensing elements, and the first sensing array being positioned along a length of a first side of the body.

\* \* \* \* \*